(12) United States Patent
He et al.

(10) Patent No.: US 10,289,888 B2
(45) Date of Patent: May 14, 2019

(54) FINGERPRINT SENSING CIRCUIT AND ELECTRICAL DEVICE

(71) Applicant: HIMAX TECHNOLOGIES LIMITED, Tainan (TW)

(72) Inventors: Jia-Ming He, Tainan (TW); Yaw-Guang Chang, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 271 days.

(21) Appl. No.: 15/397,709

(22) Filed: Jan. 3, 2017

(65) Prior Publication Data
US 2018/0189537 A1      Jul. 5, 2018

(51) Int. Cl.
*G06K 9/00* (2006.01)
*H03K 17/96* (2006.01)

(52) U.S. Cl.
CPC ......... *G06K 9/0002* (2013.01); *G06K 9/0008* (2013.01); *G06K 9/00986* (2013.01); *H03K 17/962* (2013.01); *H03K 17/9622* (2013.01); *H03K 2217/960725* (2013.01); *H03K 2217/960735* (2013.01)

(58) Field of Classification Search
None
See application file for complete search history.

(56) References Cited

U.S. PATENT DOCUMENTS

| | | | | |
|---|---|---|---|---|
| 5,905,489 A * | 5/1999 | Takahama | ............... | G06F 3/044 345/156 |
| 6,239,788 B1 * | 5/2001 | Nohno | .................. | G06F 3/0412 178/18.03 |
| 2006/0114247 A1 * | 6/2006 | Brown | ................ | G02F 1/13338 345/204 |
| 2007/0182719 A1 * | 8/2007 | Lee | ........................ | G06F 3/0412 345/173 |
| 2011/0186359 A1 * | 8/2011 | Chen | ....................... | G06F 3/044 178/18.06 |
| 2014/0333328 A1 * | 11/2014 | Nelson | .................... | G06F 3/044 324/663 |
| 2016/0239700 A1 * | 8/2016 | Yang | ..................... | G06K 9/0002 |
| 2016/0364079 A1 * | 12/2016 | Qiu | ....................... | H03K 17/962 |
| 2016/0371527 A1 | 12/2016 | Suwald | | |
| 2017/0205453 A1 * | 7/2017 | Bharathan | .......... | G01R 27/2605 |

FOREIGN PATENT DOCUMENTS

| | | |
|---|---|---|
| CN | 104978559 A | 10/2015 |
| TW | M522419 U | 5/2016 |
| TW | 201631518 A | 9/2016 |

OTHER PUBLICATIONS

Patel, Jarez, and Instructables. "How to Sort Out Route Overlapping Problems in Eagle PCB." Instructables.com, Instructables, Dec. 2016, www.instructables.com/id/How-to-sort-out-route-overlapping-problems-in-Eagl/. 1 page (Year: 2016).*

* cited by examiner

*Primary Examiner* — Ryan P Potts
(74) *Attorney, Agent, or Firm* — CKC & Partners Co., LLC

(57) ABSTRACT

The fingerprint sensing circuit including sensing electrodes, switches, a sensing line and flip flops. First terminals of the switches are respectively coupled to the sensing electrodes. The sensing line is coupled to second terminals of the switches. Output terminals of the flip flops are respectively coupled to control terminals of the switches. An input terminal of part of the flip flops is coupled to the output terminal of a previous flip flop.

12 Claims, 5 Drawing Sheets

FINGERPRINT SENSING CIRCUIT AND ELECTRICAL DEVICE

BACKGROUND

Field of Invention

The present invention relates to a fingerprint sensing circuit. More particularly, the present invention relates to the fingerprint sensing circuit with reduced process.

Description of Related Art

Human fingerprints are detailed, nearly unique, difficult to alter, and durable over the life of an individual, making them suitable as long-term markers of human identity. In general, a fingerprint sensing circuit includes multiple sensing electrode arranged as a matrix. The sensing electrodes are coupled to scan lines and sensing lines. The scan lines and the sensing lines intersect with each other and thus they belong different metal layers. Therefore, the sensing electrodes, the scan lines, and the sensing lines need at least three metal layers. In some applications, the number of the metal layer needs to be reduced due to cost.

SUMMARY

Embodiments of the invention provide a fingerprint sensing circuit including sensing electrodes, switches, a sensing line and flip flops. First terminals of the switches are respectively coupled to the sensing electrodes. The sensing line is coupled to second terminals of the switches. Output terminals of the flip flops are respectively coupled to control terminals of the switches. An input terminal of part of the flip flops is coupled to the output terminal of a previous flip flop.

In some embodiments, the sensing electrodes are formed in a first conductive layer, and the sensing line is formed in a second conductive layer.

In some embodiments, a clock signal line is formed in the second conductive layer and coupled to trigger terminals of the flip flops.

In some embodiments, the sensing line and the clock signal line extend along a first direction and parallel with each other.

In some embodiments, the flip flops are formed in an underlying circuit, and the first conductive layer and the second conductive layer are formed above the underlying circuit.

In some embodiments, the aforementioned flip flops include a first flip flop and a second flip flop. The first flip flop has an input terminal coupled to a pulse signal, and the first flip flop is the previous flip flop of the second flip flop. The second flip flop has an input terminal coupled to the output terminal of the first flip flop.

In some embodiments, the fingerprint sensing circuit further includes multiple AND gates. First input terminals of the AND gates are coupled to a selection signal. Second input terminals of the AND gates are respectively coupled to the output terminals of the flip flops. Output terminals of the AND gates are respectively coupled to the control terminals of the switches.

From another aspect, embodiments of the invention provide an electrical device including the aforementioned fingerprint sensing circuit.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

The using of "first", "second", "third", etc. in the specification should be understood for identifying units or data described by the same terminology, but are not referred to particular order or sequence. In addition, the term "couple" used in the specification should be understood for electrically connecting two units directly or indirectly. In other words, when "a first object is coupled to a second object" is written in the specification, it means another object may be disposed between the first object and the second object.

Figure 1:
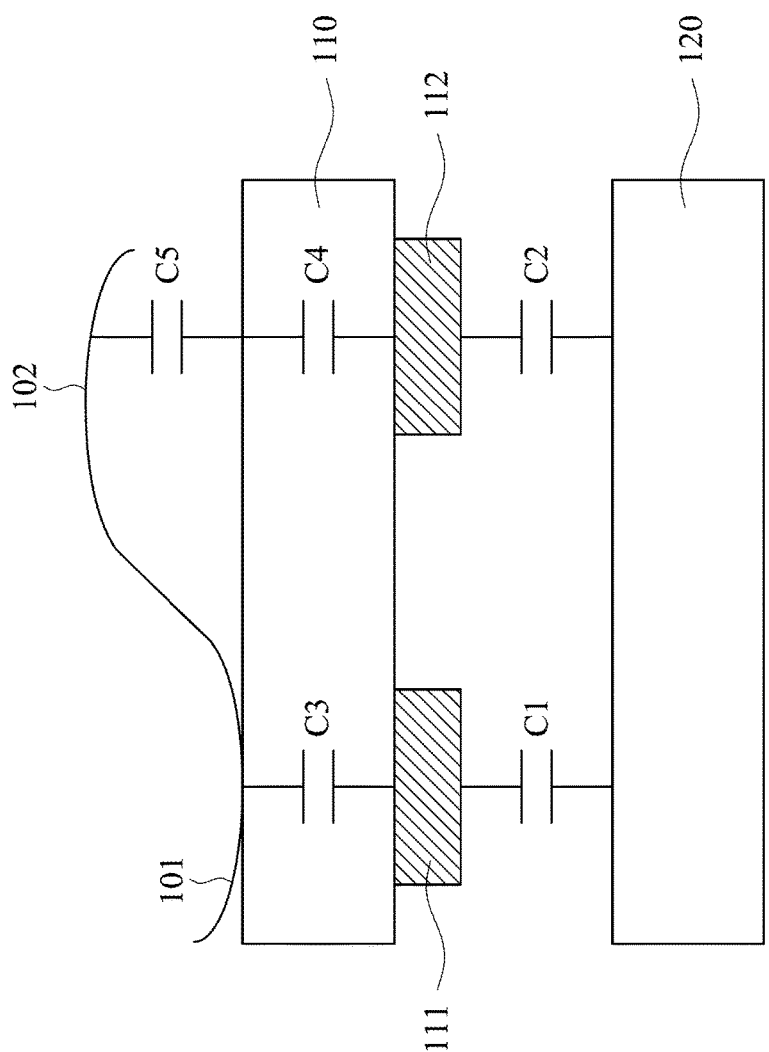
FIG. 1 is a schematic diagram illustrating capacitive fingerprint sensing according to an embodiment.

FIG. 1 is a schematic diagram illustrating capacitive fingerprint sensing according to an embodiment. Referring to FIG. 1, human finger has ridge 101 and valley 102. When the finger touches a passivation layer 110, a distance between the ridge 101 and a surface of the passivation layer 110 is shorter than a distance between the valley 102 and the surface of the passivation layer 110. One side of the passivation layer 110 faces the user, and sensing electrodes 111 and 112 are disposed on the other side of the passivation layer 110. A capacitor C1 is formed between the sensing electrode 111 and a substrate 120, and a capacitor C2 is formed between the sensing electrode 112 and the substrate 120. As shown in FIG. 1, a capacitor C3 is formed between the ridge 101 and the sensing electrode 111, and a capacitor C4 and a capacitor C5 are formed between the valley 102 and the sensing electrode 112. The capacitances on the sensing electrodes 111 and 112 are different from each other, and therefore the ridge 101 and the valley 102 are recognized by detecting the capacitances on the sensing electrodes 111 and 112.

Figure 2:
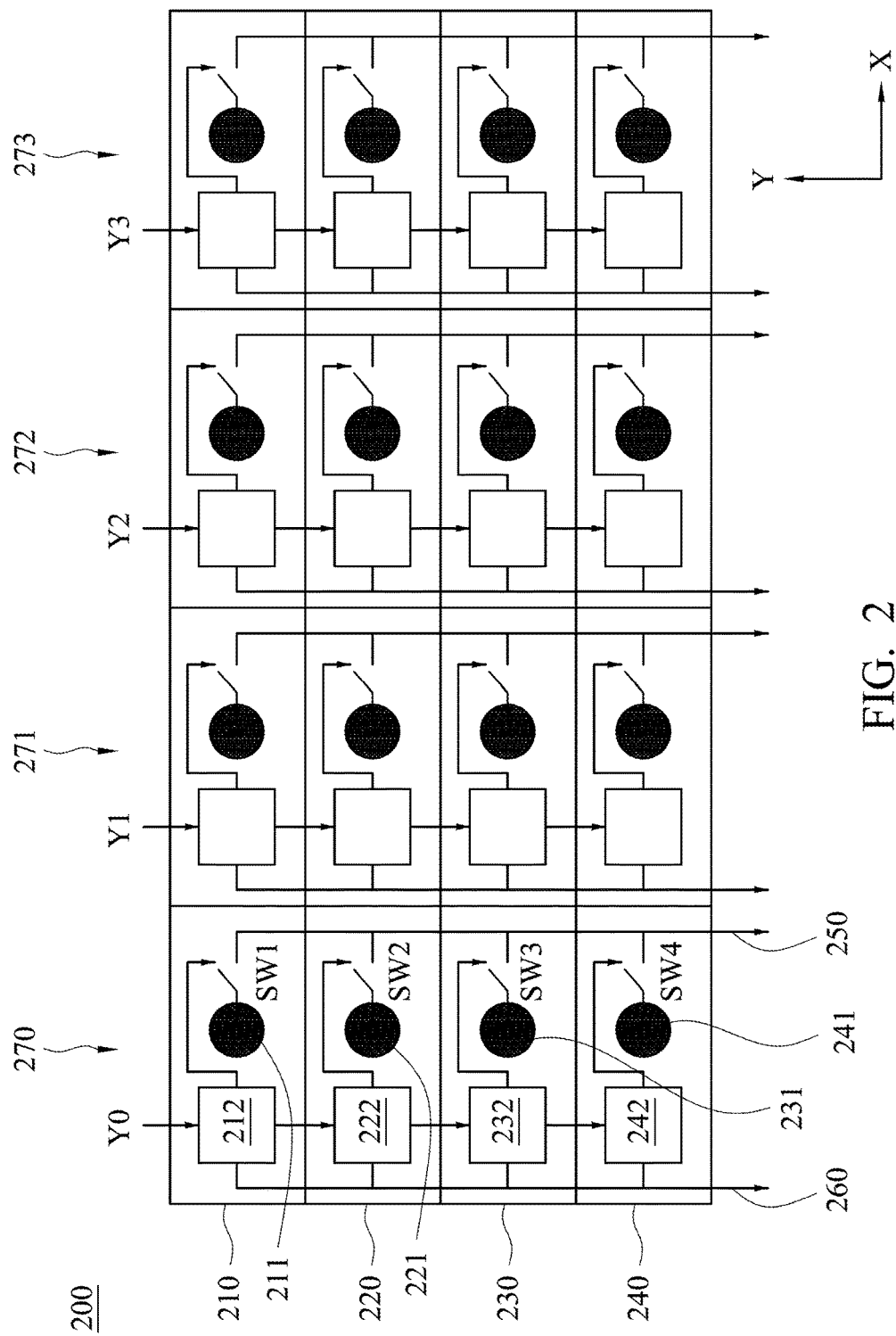
FIG. 2 is a schematic diagram illustrating a fingerprint sensing circuit according to an embodiment.

FIG. 2 is a schematic diagram illustrating a fingerprint sensing circuit according to an embodiment. Referring to FIG. 2, a fingerprint sensing circuit 200 is disposed in an electrical device which may be a cell phone, a laptop, an industry computer, a server or any forms of electrical device, which is not limited in the invention.

The fingerprint sensing circuit 200 includes multiple pixels (also referred to sensing areas or sensing structures) arranged as a matrix. In the embodiment of FIG. 2, a first column 270, a second column 271, a third column 272 and a fourth column 273 are arranged along an X direction, and there are four rows arranged along a Y direction. However, the matrix is just an example, and the size of the matrix is not limited in the invention. Each pixel includes a sensing electrode, a switch and a flip flop. Herein, pixels 210, 220, 230, and 240 are taken as examples. The pixel 210 includes a sensing electrode 211, a switch SW1 and a flip flop 212; the pixel 220 includes a sensing electrode 221, a switch SW2 and a flip flop 222; the pixel 230 includes a sensing electrode 231, a switch SW3 and a flip flop 232; the pixel 240 includes a sensing electrode 241, a switch SW4 and a flip flop 242. The pixels 210, 220, 230 and 240 are arranged along the Y direction.

First terminals of the switches SW1, SW2, SW3 and SW4 are respectively coupled to the sensing electrodes 211, 221, 231 and 241. Second terminals of the switches SW1, SW2, SW3 and SW4 are coupled to a sensing line 250. Herein, the flip flop 212 is a previous flip flop of the flip flop 222; the flip flop 222 is a previous flip flop of the flip flop 232; the flip flop 232 is a previous flip flop of the flip flop 242. An input terminal of the flip flop 212 receives a pulse signal Y0, and input terminals of the flip flops 222, 232 and 242 are coupled to the output terminal of the corresponding previous flip flop. To be specific, the input terminal of the flip flop 222 is coupled to the output terminal of the flip flop 212 for receiving a signal Y0_0; the input terminal of the flip flop 232 is coupled to the output terminal of the flip flop 222 for receiving a signal Y0_1; the input terminal of the flip flop 242 is coupled to the output terminal of the flip flop 232 for receiving a signal Y0_3. Trigger terminals of the flip flops 212, 222, 232 and 242 are coupled to a clock signal line 260. In the embodiment, the clock signal line 260 and the sensing line 250 extend along the Y direction, and the switches SW1-SW4 are controlled by the flip flops 212, 222, 232 and 242. Therefore, there is no need to dispose a signal line along the X direction to control the switches SW1-SW4.

Figure 3:
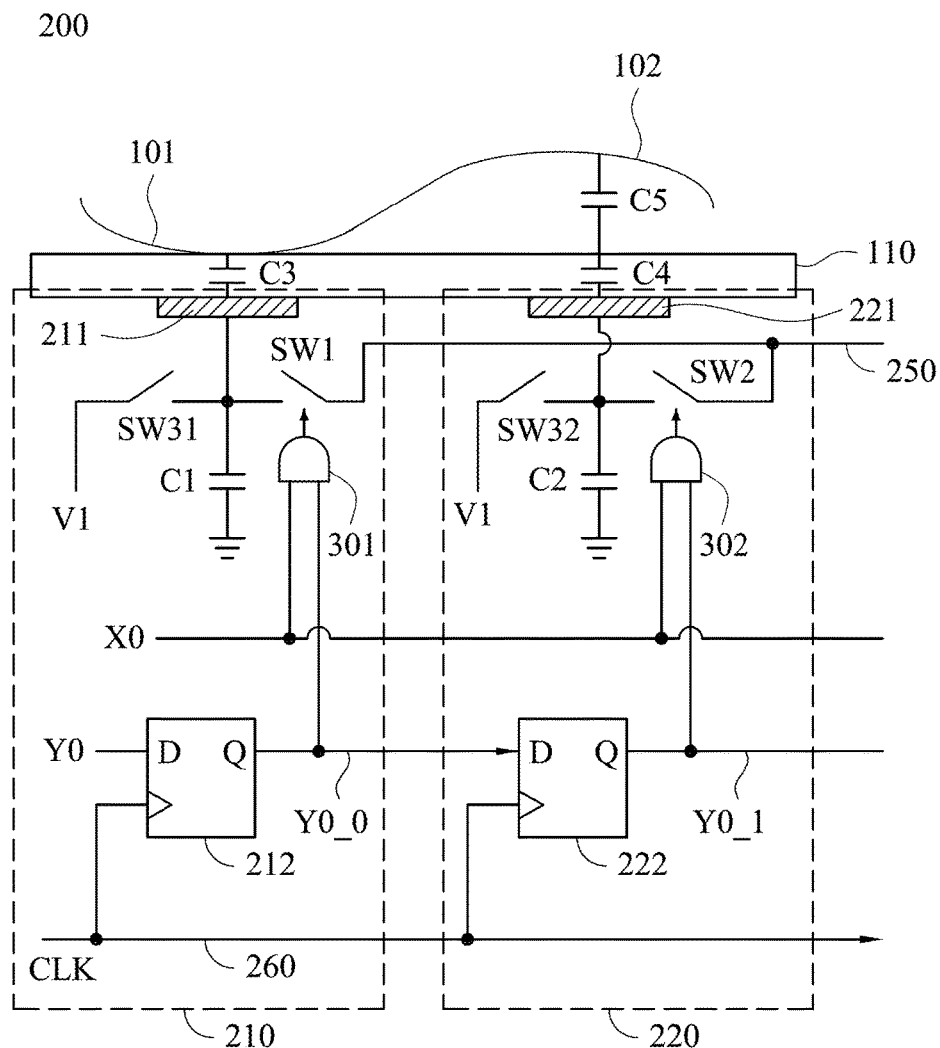
FIG. 3 is a circuit diagram illustrating part of the fingerprint sensing circuit according to an embodiment.
Figure 4:
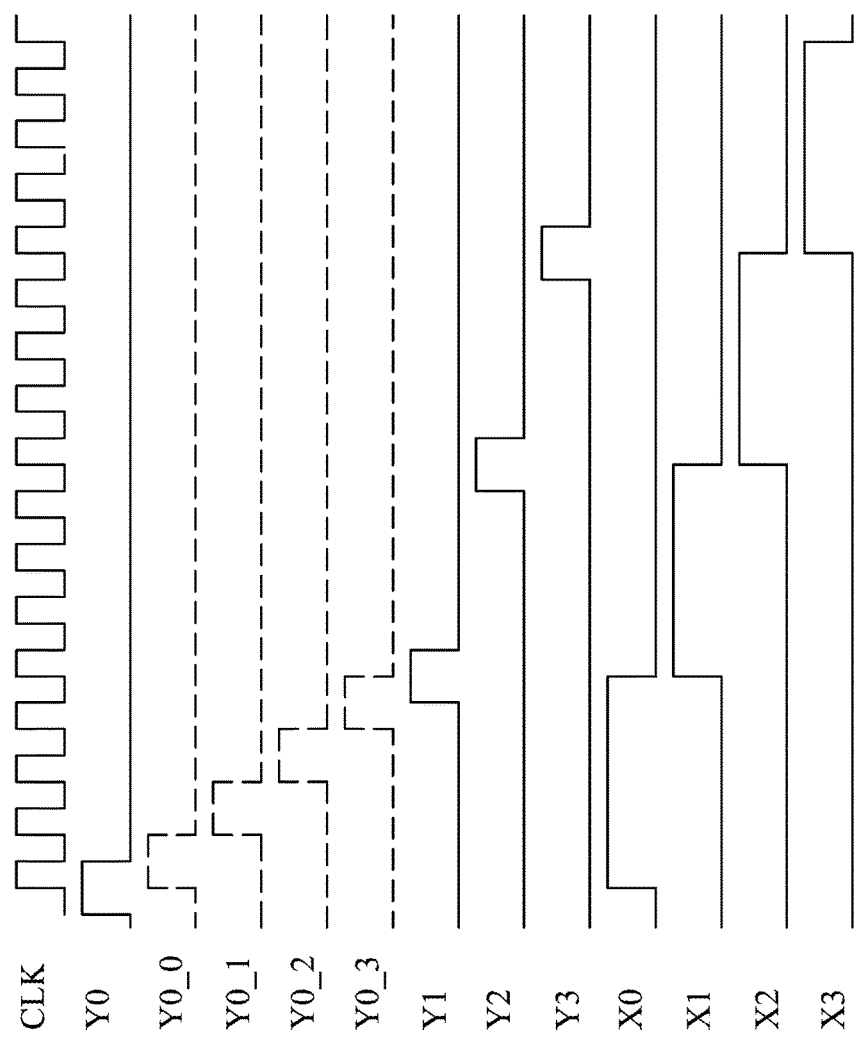
FIG. 4 is a timing diagram of signals in the fingerprint sensing circuit according to an embodiment.

In detail, FIG. 3 is a circuit diagram illustrating part of the fingerprint sensing circuit according to an embodiment. Referring to FIG. 2 and FIG. 3, the pixels 210 and 220 are taken as examples. In the embodiment of FIG. 3, each pixel further includes an AND gate (e.g. AND gates 301 and 302) and a switch (e.g. switches SW31 and SW32). An output terminal of the AND gate 301 is coupled to the control terminal of the switch SW1. An output terminal of the AND gate 302 is coupled to the control terminal of the switch SW2. First input terminals of the AND gates 301 and 302 are coupled to a selection signal X0. A second input terminal of the AND gate 301 is coupled to the output terminal Q of the flip flop 212. A second input terminal of the AND gate 302 is coupled to the output terminal Q of the flip flop 222. During a first period, the switches SW31 and SW32 are turned on and the switches SW1 and SW2 are turn off, and thus the sensing electrodes 211 and 221 are charged by a voltage V1. During a second period, the switches SW31 and SW32 are turned off, and the switches SW1 and SW2 are sequentially turned on to sense the voltages on the sensing electrodes 211 and 221. Referring to FIG. 3 and FIG. 4, FIG. 4 is a timing diagram of signals in the fingerprint sensing circuit according to an embodiment. First, the selection signal X0 and pulse signal Y0 rise, in which the width of the pulse signal Y0 is equal to a period of the clock CLK. Then, the signal Y0_0 outputted by the flip flop 212 rises, and thus the AND gate 301 output a signal of logical "1" to turn on the switch SW1 so that the voltage on the sensing electrode 211 is transmitted to a sensing circuit (not shown) through the sensing line 250. In the next clock, the signal Y0_1 outputted by the flip flop 222 rises, and thus the AND gate 302 output a signal of logical "1" to turn on the switch SW2 so that the voltage on the sensing electrode 221 is transmitted to the sensing circuit through the sensing line 250.

Referring to FIG. 2 and FIG. 4, operations for columns 271, 272 and 273 are similar to that of column 270. Input terminals of AND gates at the second column 271 are coupled to a signal X1, and an input terminal of the flip flop of the pixel at the first row and the second column 271 is coupled to a signal Y1; input terminals of the AND gates at third column 272 are coupled to a signal X2, and an input terminal of the flip flop of the pixel at the third column 272 and the first row is coupled to a signal Y2; input terminals of the AND gates at the fourth column 273 are coupled to a signal X3, and an input terminal of the flip flop of the pixel at the fourth column 273 and the first row is coupled to a signal Y3. As a result, after the voltages on the sensing electrodes of the pixels at the first column 270 are sensed, the voltages on the sensing electrodes of the pixels at the second column 271, the third column 272 and the fourth column 273 are sensed sequentially. The sensing of the voltages are similar to the operation described in FIG. 3, and therefore the description will not be repeated.

In the embodiment of FIG. 3 the flip flops 212 and 222 are D flip flops. However, SR flip flop, JK flip flop or other suitable flip flop may be adopted in other embodiments, and the invention is not limited thereto. In addition, the switches SW1 and SW2 may be Metal-Oxide-Semiconductor Field-Effect Transistor (MOSFET). In some embodiments, the switches SW1 and SW2 may also be Thin Film Transistor (TFT). The aforementioned control terminal may be gate of the transistor, the first terminal may be one of drain and source, and the second terminal may be the other one of drain and source.

Figure 5:
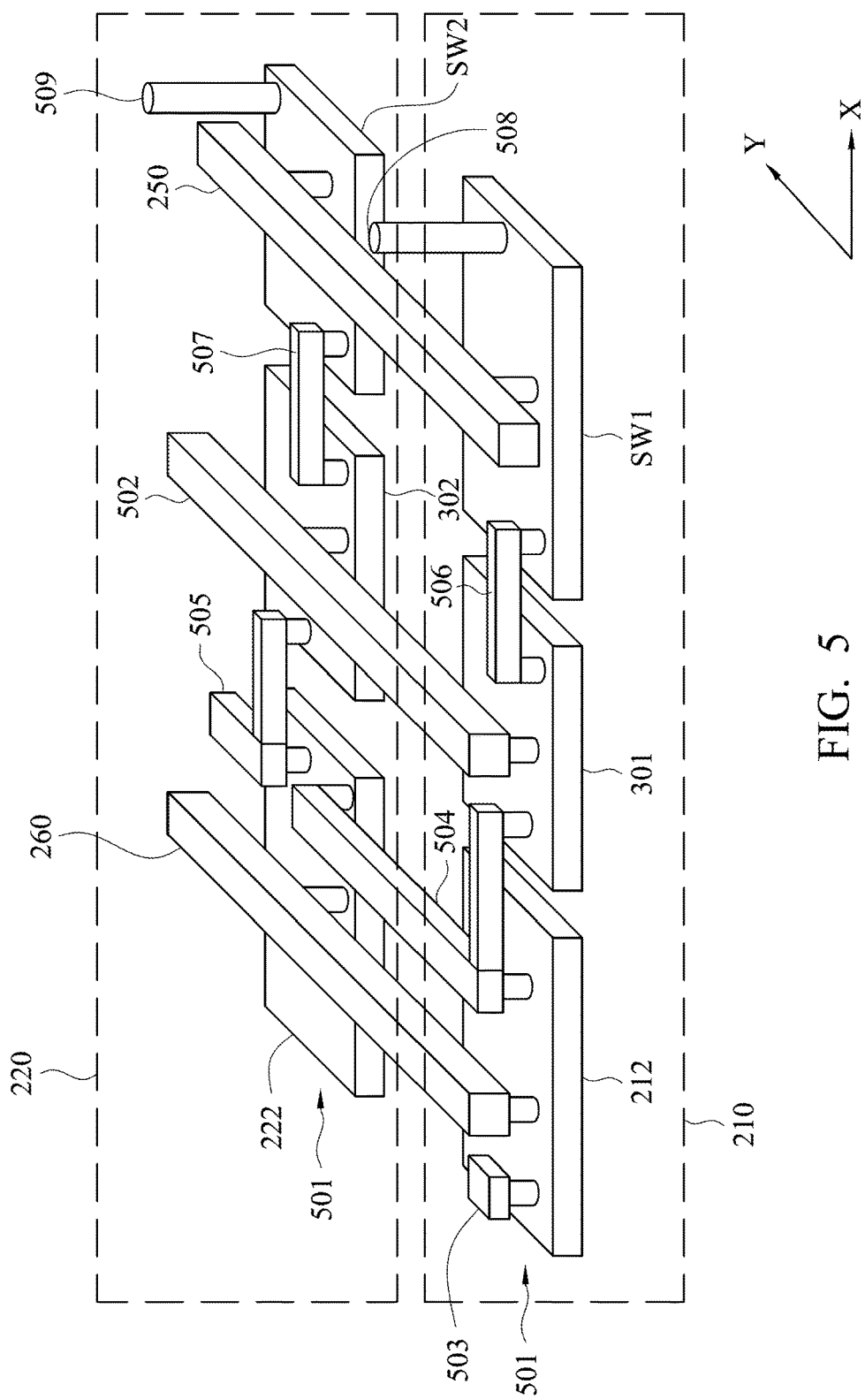
FIG. 5 is a schematic diagram illustrating the underlying circuit according to an embodiment.

It is worth mentioning that the fingerprint sensing circuit is formed on a chip which area is generally large so that sufficient fingerprint features are obtained when the user puts his fingers on the chip. Accordingly, the area of the sensing electrodes on the chip would also be large. On the other hand, the flip flops 212, 222, 232 and 242, the AND gates 301 and 302 and the sensing circuit are formed in an underlying circuit beneath the sensing electrodes, and the area of the underlying circuit is generally less than that of the chip. Therefore, even additional flip flops 212, 222, 232 and 242 are added in the embodiment, the area of the chip would not be increased. For example, FIG. 5 is a schematic diagram illustrating the underlying circuit according to an embodiment. Structures of the pixels 210 and 220 are shown in FIG. 5. The flip flops 212 and 222, the AND gates 301 and 302, and the switches SW1 and SW2 are formed in underlying circuits 501. The clock signal line 260, a signal line 502, and the signal line 250 are formed in a second conductive layer above the underlying circuits 501. The signal line 502 is used to transmit the selection signal X0. Conductive features 503-507 are also formed in the second conductive layer. The conductive feature 503 is connected to the flip flop 212 and used to transmit the pulse signal Y0. The conductive feature 504 is connected to the flip flops 212 and 222 and the AND gate 301. The signal Y0_0 is transmitted on the conductive feature 504 between the flip flops 212 and 222. The conductive feature 505 is used to transmit the signal Y0_1. The conductive feature 506 is connected to the AND gate 301 and the switch SW1. The conductive feature 507 is connected to the AND gate 302 and the switch SW2. Contact structures 508 and 509 are connected to the switches SW1 and SW2 respectively. Note that the contact structure 508 is also connected to the sensing electrode 211 (not shown in FIG. 5) which is formed in a first conductive layer above the second conductive layer. The contact structure 509 is connected to the sensing electrode 221 (not shown in FIG. 5) which is formed in the first conductive layer. In other words, the first conductive layer and the second conductive layer are formed above the underlying circuit 501. In some embodiments, the first conductive layer and the second conductive layer may be metal or other suitable conductive material, which is not limited in the invention. The signal lines 260, 502 and 250 extend toward the Y direction (also referred to first direction) and are parallel with each other. In the embodiment, there is no need to dispose a signal line toward the X direction, and thus the chip process is reduced (do not need a third conductive layer).

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A fingerprint sensing circuit, comprising:
   a plurality of sensing electrodes;
   a plurality of switches, wherein first terminals of the switches are respectively coupled to the sensing electrodes;
   a sensing line, coupled to second terminals of the switches;
   a plurality of flip flops, wherein each of the flip flops comprises an output terminal, the output terminals of the flip flops are respectively coupled to control terminals of the switches, and an input terminal of part of the flip flops is coupled to the output terminal of a previous flip flop of the flip flops; and
   a plurality of AND gates, wherein first input terminals of the AND gates are coupled to a selection signal, second input terminals of the AND gates are respectively coupled to the output terminals of the flip flops, and output terminals of the AND gates are respectively coupled to the control terminals of the switches.

2. The fingerprint sensing circuit of claim 1, wherein the sensing electrodes are formed in a first conductive layer, and the sensing line is formed in a second conductive layer.

3. The fingerprint sensing circuit of claim 2, further comprising:
   a clock signal line formed in the second conductive layer and coupled to trigger terminals of the flip flops.

4. The fingerprint sensing circuit of claim 3, wherein the sensing line and the clock signal line extend along a first direction and parallel with each other.

5. The fingerprint sensing circuit of claim 4, wherein the flip flops are formed in an underlying circuit, and the first conductive layer and the second conductive layer are formed above the underlying circuit.

6. The fingerprint sensing circuit of claim 1, wherein the flip flops comprise:
   a first flip flop having an input terminal coupled to a pulse signal; and
   a second flip flop having an input terminal coupled to the output terminal of the first flip flop.

7. An electrical device comprising a fingerprint sensing circuit, wherein the fingerprint sensing circuit comprises:
   a plurality of sensing electrodes;
   a plurality of switches, wherein first terminals of the switches are respectively coupled to the sensing electrodes;
   a sensing line, coupled to second terminals of the switches;
   a plurality of flip flops, wherein each of the flip flops comprises an output terminal, the output terminals of the flip flops are respectively coupled to control terminals of the switches, and an input terminal of part of the flip flops is coupled to the output terminal of a previous flip flop of the flip flops; and
   a plurality of AND gates, wherein first input terminals of the AND gates are coupled to a selection signal, second input terminals of the AND gates are respectively coupled to the output terminals of the flip flops, and output terminals of the AND gates are respectively coupled to the control terminals of the switches.

8. The electrical device of claim 7, wherein the sensing electrodes are formed in a first conductive layer, and the sensing line is formed in a second conductive layer.

9. The electrical device of claim 8, further comprising:
   a clock signal line formed in the second conductive layer and coupled to trigger terminals of the flip flops.

10. The electrical device of claim 9, wherein the sensing line and the clock signal line extend along a first direction and parallel with each other.

11. The electrical device of claim 10, wherein the flip flops are formed in an underlying circuit, and the first conductive layer and the second conductive layer are formed above the underlying circuit.

12. The electrical device of claim 7, wherein the flip flops comprise:
   a first flip flop having an input terminal coupled to a pulse signal; and
   a second flip flop having an input terminal coupled to the output terminal of the first flip flop.

* * * * *